United States Patent
Sim et al.

(10) Patent No.: US 11,209,326 B2
(45) Date of Patent: Dec. 28, 2021

(54) PRESSURE SENSOR DEVICE FORMED IN BOARD AND ELECTRONIC DEVICE INCLUDING THE SAME

(71) Applicant: Samsung Electronics Co., Ltd., Suwon-si (KR)

(72) Inventors: Hyunwoo Sim, Suwon-si (KR); Seongjun Kim, Suwon-si (KR); Yonghwa Kim, Suwon-si (KR); Dongil Son, Suwon-si (KR); Jaedeok Lim, Suwon-si (KR); Seungbum Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/506,251

(22) Filed: Jul. 9, 2019

(65) Prior Publication Data

US 2020/0018657 A1 Jan. 16, 2020

(30) Foreign Application Priority Data

Jul. 10, 2018 (KR) ........................ 10-2018-0079942

(51) Int. Cl.
*G01L 1/22* (2006.01)
*H05K 1/02* (2006.01)
*G06F 3/045* (2006.01)

(52) U.S. Cl.
CPC ............ *G01L 1/2287* (2013.01); *G06F 3/045* (2013.01); *H05K 1/028* (2013.01); *H05K 1/0296* (2013.01); *H05K 2201/10151* (2013.01)

(58) Field of Classification Search
CPC .................. G06F 3/045; G06F 1/1684; G06F 2203/04105; G01L 1/2287; G01L 1/205;
(Continued)

(56) References Cited

U.S. PATENT DOCUMENTS 5,010,774 A * 4/1991 Kikuo .................... G06F 3/011
  73/862.046
2013/0285970 A1 10/2013 Ahn et al.
(Continued)

FOREIGN PATENT DOCUMENTS

KR  10-2018-0016035 A  2/2018
KR  10-2018-0017388 A  2/2018
(Continued)

OTHER PUBLICATIONS

International Search Report and Written Opinion dated Oct. 15, 2019, issued in an International application No. PCT/KR2019/008488.
(Continued)

*Primary Examiner* — Ryan A Lubit
(74) *Attorney, Agent, or Firm* — Jefferson IP Law, LLP

(57) ABSTRACT

An electronic device for detecting pressure is provided. The electronic device includes a printed circuit board (PCB) including at least one element or circuit pattern for driving the electronic device, at least one electrode pattern formed to detect a pressure in the wiring layer included in the PCB, an elastic member arranged to be at least partially overlapped with the electrode pattern, and a pressure sensor circuit electrically connected to the electrode pattern included in the PCB. The pressure sensor circuit is configured to apply a voltage to the electrode pattern and measure intensity of the pressure based on a change in the voltage applied to the electrode pattern.

12 Claims, 16 Drawing Sheets

(58) Field of Classification Search
CPC ................ H05K 1/028; H05K 1/0296; H05K 2201/10151
See application file for complete search history.

(56) References Cited

U.S. PATENT DOCUMENTS

| | | | |
|---|---|---|---|
| 2015/0192482 A1* | 7/2015 | Araki | G01L 5/0038 |
| | | | 73/862.627 |
| 2016/0195955 A1 | 7/2016 | Picciotto et al. | |
| 2016/0234932 A1* | 8/2016 | Oshima | H05K 1/036 |
| 2017/0185186 A1* | 6/2017 | Liu | G06F 3/0447 |
| 2018/0004334 A1* | 1/2018 | Park | G06F 3/04164 |
| 2018/0042127 A1 | 2/2018 | Kim et al. | |
| 2018/0046305 A1 | 2/2018 | Kang et al. | |
| 2018/0067569 A1* | 3/2018 | Heung | G06F 3/04883 |
| 2018/0081466 A1 | 3/2018 | Moon | |
| 2018/0143725 A1 | 5/2018 | Nathan et al. | |
| 2018/0365466 A1* | 12/2018 | Shim | G06K 9/0004 |
| 2019/0155450 A1* | 5/2019 | Kim | G01L 1/26 |
| 2019/0171315 A1 | 6/2019 | Park et al. | |

FOREIGN PATENT DOCUMENTS

| | | |
|---|---|---|
| KR | 10-2018-0048179 A | 5/2018 |
| KR | 10-1865302 B1 | 6/2018 |
| WO | 2016-111876 A1 | 7/2016 |

OTHER PUBLICATIONS

European Search Report dated May 21, 2021, issued in European Application No. 19834313.9.

* cited by examiner

PRESSURE SENSOR DEVICE FORMED IN BOARD AND ELECTRONIC DEVICE INCLUDING THE SAME

CROSS-REFERENCE TO RELATED APPLICATION(S)

This application is based on and claims priority under 35 U.S.C. § 119 of a Korean patent application number 10-2018-0079942, filed on Jul. 10, 2018, in the Korean Intellectual Property Office, the disclosure of which is incorporated by reference herein in its entirety.

BACKGROUND

1. Field

The disclosure relates to a pressure sensor device formed in a board and an electronic device including the same.

2. Description of Related Art

Electronic devices may include at least one input device. For example, an electronic device using a touch screen as a main input device may provide a pressure sensor for detecting the intensity of pressure to another input device.

In general, a pressure sensor module (or device) may be implemented into a separate component for performing a separate process independently of a display or a main board. Therefore, there are disadvantages that production costs of the electronic device increase and that a mounting space to mount a connector for connecting a main board and a pressure sensor module of the electronic device is required.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mention problems and/or disadvantages and to provide at least the advantages described below. Accordingly, an aspect of the disclosure is to provide an electric device that can implement at least one sensor electrode of a pressure sensor module in a main printed circuit board in order to reduce production costs while securing a mounting region for mounting the pressure sensor module.

Additional aspects will be set forth in part in the description which follows and, in part, will be apparent from the description, or may be learned by practice of the presented embodiments.

In accordance with an aspect of the disclosure, an electronic device is provided (e.g., the electronic device 100 of FIG. 1A, the electronic device 200 of FIG. 2, the electronic device 301 of FIG. 3, the electronic device 401 of FIG. 4, the electronic device 501 of FIGS. 5A and 5B, the electronic device 601 of FIGS. 6A and 6B, the electronic device 701 of FIG. 7, the electronic device 801 of FIG. 8, and the electronic device 901 of FIG. 9). The electronic device includes a printed circuit board (PCB) (e.g., the PCB 210 of FIG. 2, the PCB 310 of FIG. 3, the PCB 410 of FIG. 4, the PCB 510 of FIGS. 5A and 5B, the PCB 610 of FIGS. 6A and 6B, the PCB 710 of FIG. 7, the PCB 810 of FIG. 8, and the PCB 910 of FIG. 9) including at least one element or circuit pattern for driving the electronic device, at least one electrode pattern (e.g., the first electrode pattern 350 of FIG. 3, the first electrode pattern 450 of FIG. 4, the first electrode pattern 550 of FIGS. 5A and 5B, the first electrode pattern 650 of FIGS. 6A and 6B, the first electrode pattern 750 of FIG. 7, the first electrode pattern 850 of FIG. 8, and the PCB 910 of FIG. 9) formed to detect pressure in the wiring layer included in the PCB, an elastic member (e.g., the elastic layer 360 of FIG. 3, the elastic layer 460 of FIG. 4, the elastic layer 560 of FIGS. 5A and 5B, the elastic layer 660 of FIGS. 6A and 6B, the elastic layer 760 of FIG. 7, the elastic layer 860 of FIG. 8, and the elastic layer 960 of FIG. 9) arranged to be at least partially overlapped with the electrode pattern, and a pressure sensor circuit (e.g., the pressure sensor circuit 570 of FIGS. 5A and 5B, and the pressure sensor circuit 670 of FIGS. 6A and 6B) electrically connected to the electrode pattern included in the PCB and for applying a voltage to the electrode pattern and for measuring the intensity of the pressure based on a change in the voltage applied to the electrode pattern.

In accordance with another aspect of the disclosure, an electronic device is provided (e.g., the electronic device 100 of FIG. 1A, the electronic device 200 of FIG. 2, the electronic device 301 of FIG. 3, the electronic device 401 of FIG. 4, the electronic device 501 of FIGS. 5A and 5B, the electronic device 601 of FIGS. 6A and 6B, the electronic device 701 of FIG. 7, the electronic device 801 of FIG. 8, and the electronic device 901 of FIG. 9). The electronic device includes a PCB (e.g., the PCB 210 of FIG. 2, the PCB 310 of FIG. 3, the PCB 410 of FIG. 4, the PCB 510 of FIGS. 5A and 5B, the printing circuit board 610 of FIGS. 6A and 6B, the PCB 710 of FIG. 7, the PCB 810 of FIG. 8, and the PCB 910 of FIG. 9) in which at least one element or circuit pattern for driving the electronic device is formed, at least one first electrode pattern (e.g., the first electrode pattern 350 of FIG. 3, the first electrode pattern 450 of FIG. 4, the first electrode pattern 550 of FIGS. 5A and 5B, the first electrode pattern 650 of FIGS. 6A and 6B, the first electrode pattern 750 of FIG. 7, the first electrode pattern 850 of FIG. 8, and the first electrode pattern 950 of FIG. 9) and second electrode pattern (e.g., second first electrode pattern 355 of FIG. 3, the second electrode pattern 455 of FIG. 4, the second electrode pattern 555 of FIGS. 5A and 5B, the second electrode pattern 655 of FIGS. 6A and 6B, the second electrode pattern 755 of FIG. 7, the second electrode pattern 855 of FIG. 8, and the second electrode pattern 955 of FIG. 9) formed to detect pressure in a wiring layer included in the PCB, an elastic member (e.g., the elastic layer 360 of FIG. 3, the elastic layer 460 of FIG. 4, the elastic layer 560 of FIGS. 5A and 5B, the elastic layer 660 of FIGS. 6A and 6B, the elastic layer 760 of FIG. 7, the elastic layer 860 of FIG. 8, and the elastic layer 960 of FIG. 9) arranged to be at least partially overlapped with the first electrode pattern and the second electrode pattern, and a pressure sensor circuit (e.g., the pressure sensor circuit 570 of FIGS. 5A and 5B and the pressure sensor circuit 670 of FIGS. 6A and 6B) electrically connected to the first electrode pattern included in the PCB and for applying a voltage to the first electrode pattern and for measuring intensity of the pressure based on the applied voltage change, wherein the PCB may be formed in a folded structure such that a region in which the first electrode pattern is formed and a region in which a second electrode pattern is formed are opposite to each other.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

Figure 1A:
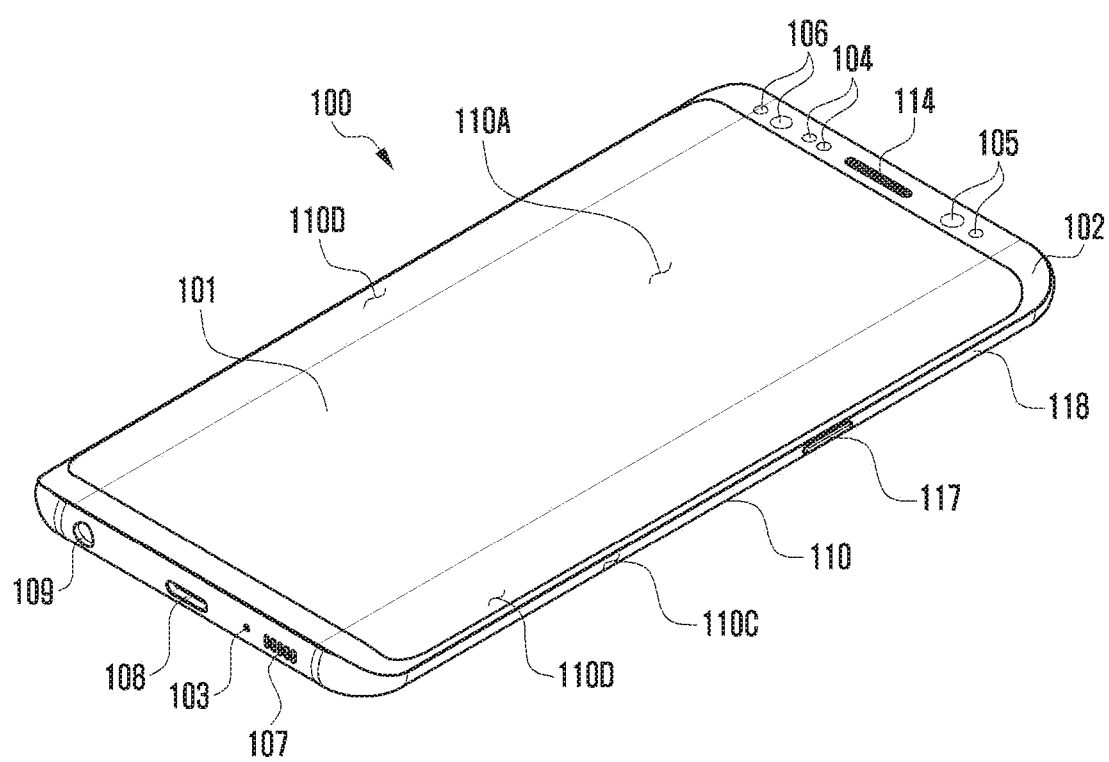
FIG. 1A is a perspective view of the front surface of a mobile electronic device according to an embodiment of the disclosure.
Figure 1B:
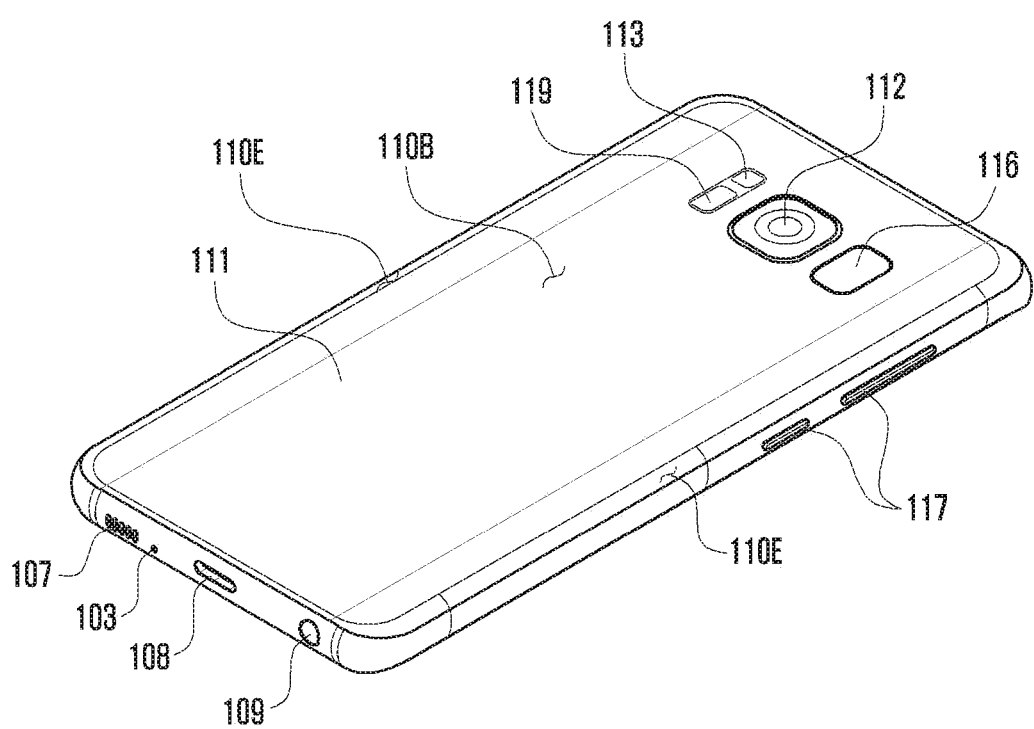
FIG. 1B is a perspective view of the rear surface of the electronic device of FIG. 1A according to an embodiment of the disclosure.

FIG. 1A is a perspective view of the front surface of a mobile electronic device according to an embodiment of the disclosure, FIG. 1B is a perspective view of the rear surface of the electronic device of FIG. 1A according to an embodiment of the disclosure.

Referring to FIGS. 1A and 1B, an electronic device 100 according to an embodiment may include a housing 110 including a first surface (or front surface) 110A, a second surface (or rear surface) 110B, and a side surface 110C surrounding the space between the first surface 110A and the second surface 110B. In another embodiment (not illustrated), the housing may denote a structure that forms a part of the first surface 110A, the second surface 110B, and the side surface 110C illustrated in FIG. 1A. According to an embodiment, the first surface 110A may be formed by a front plate 102, at least a part of which is substantially transparent (for example, a glass plate including various coating layers, or a polymer plate). The second surface 110B may be formed by a rear plate 111 that is substantially opaque. The rear plate 111 may be made of coated or colored glass, ceramic, polymer, metal (for example, aluminum, stainless steel (STS), or magnesium), or a combination of at least two of the above-mentioned materials. The side surface 110C may be formed by a side bezel structure (or "side member") 118 which is coupled to the front plate 102 and to the rear plate 111, and which includes metal and/or polymer. In some embodiments, the rear plate 111 and the side bezel structure 118 may be formed integrally and may include the same material (for example, a metal material such as aluminum).

In the illustrated embodiment, the front plate 102 may include two first areas 110D on both ends of the long edge of the front plate 102 such that the two first areas 110D bend from the first surface 110A toward the rear plate 111 and extend seamlessly. In the illustrated embodiment (see FIG. 2), the rear plate 111 may include two second areas 110E on both ends of the long edge such that the two second areas 110E bend from the second surface 110B toward the front plate 102 and extend seamlessly. In some embodiments, the front plate 102 (or the rear plate 111) may include only one of the first areas 110D (or the second areas 110E). In another embodiment, a part of the first areas 110D or the second areas 110E may not be included. In the above embodiments, when seen from the side surface of the electronic device 100, the side bezel structure 118 may have a first thickness (or width) on a part of the side surface, which does not include the first areas 110D or the second areas 110E as described above, and may have a second thickness that is smaller than the first thickness on a part of the side surface, which includes the first areas 110D or the second areas 110E.

According to an embodiment, the electronic device 100 may include at least one of a display 101, audio modules 103, 107, and 114, sensor modules 104, 116, and 119, camera modules 105, 112, and 113, a key input device 117, a light-emitting element 106, and connector holes 108 and 109. In some embodiments, at least one of the constituent elements (for example, the key input device 117 or the light-emitting element 106) of the electronic device 100 may be omitted, or the electronic device 100 may additionally include another constituent element.

The display 101 may be exposed through a corresponding part of the front plate 102, for example. In some embodiments, at least a part of the display 101 may be exposed through the front plate 102 that forms the first areas 110D of the side surface 110C and the first surface 110A. In some embodiments, the display 101 may have a corner formed in substantially the same shape as that of the adjacent outer periphery of the front plate 102. In another embodiment (not illustrated), in order to increase the area of exposure of the display 101, the interval between the outer periphery of the display 101 and the outer periphery of the front plate 102 may be formed to be substantially identical.

In another embodiment (not illustrated), a recess or an opening may be formed in a part of the screen display area of the display 101, and at least one of an audio module 114, a sensor module 104, a camera module 105, and a light-emitting element 106 may be included and aligned with the recess or the opening. In another embodiment (not illustrated), on the back surface of the screen display area of the display 101, at least one of an audio module 114, a sensor module 104, a camera module 105, a fingerprint sensor 116, and a light-emitting element 106 may be included. In another embodiment (not illustrated), the display 101 may be coupled to or arranged adjacent to a touch sensing circuit, a pressure sensor capable of measuring the intensity (pressure) of a touch, and/or a digitizer that detects a magnetic field-type stylus pen. In some embodiments, at least a part of the sensor modules 104 and 119 and/or at least a part of the key input device 117 may be arranged in the first areas 110D and/or the second areas 110E.

The audio modules 103, 107, and 114 may include a microphone hole 103 and speaker holes 107 and 114. A microphone for acquiring an external sound may be arranged in the microphone hole 103, and a plurality of microphones may be arranged therein such that the direction of a sound can be sensed in some embodiments. The speaker holes 107 and 114 may include an outer speaker hole 107 and a speech receiver hole 114. In some embodiments, the speaker holes 107 and 114 and the microphone hole 103 may be implemented as a single hole, or a speaker may be included (for example, a piezoelectric speaker) without the speaker holes 107 and 114.

The sensor modules 104, 116, and 119 may generate an electric signal or a data value corresponding to the internal operating condition of the electronic device 100 or the external environment condition thereof. The sensor modules 104, 116, and 119 may include, for example, a first sensor module 104 (for example, a proximity sensor) arranged on the first surface 110A of the housing 110, and/or a second sensor module (not illustrated) (for example, a fingerprint sensor), and/or a third sensor module 119 (for example, a heart-rate monitor (HRM sensor)) arranged on the second surface 110B of the housing 110, and/or a fourth sensor module 116 (for example, a fingerprint sensor). The fingerprint sensor may be arranged not only on the first surface 110A (for example, the display 101) of the housing 110, but also on the second surface 110B thereof. The electronic device 100 may further include a sensor module not illustrated, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 104.

The camera modules 105, 112, and 113 may include a first camera device 105 arranged on the first surface 110A of the electronic device 100, a second camera device 112 arranged on the second surface 110B thereof, and/or a flash 113. The camera devices 105 and 112 may include a single lens or a plurality of lenses, an image sensor, and/or an image signal processor (ISP). The flash 113 may include, for example, a light-emitting diode or a xenon lamp. In some embodiments, two or more lenses (an infrared (IR) camera, a wide-angle lens, and a telephoto lens) and image sensors may be arranged on a single surface of the electronic device 100.

The key input device 117 may be arranged on the side surface 110C of the housing 110. In another embodiment, the electronic device 100 may not include a part of the above-mentioned key input device 117 or the entire key input device 117, and the key input device 117 (not included) may be implemented in another type, such as a soft key, on the display 101. In some embodiments, the key input device may include a sensor module 116 arranged on the second surface 110B of the housing 110.

The light-emitting element 106 may be arranged on the first surface 110A of the housing 110, for example. The light-emitting element 106 may provide information regarding the condition of the electronic device 100 in a light type, for example. In another embodiment, the light-emitting element 106 may provide a light source that interworks with operation of the camera module 105, for example. The light-emitting element 106 may include, for example, an LED, an IR LED, and a xenon lamp.

The connector holes 108 and 109 may include a first connector hole 108 capable of containing a connector (for example, a USB connector) for transmitting/receiving power and/or data to/from an external electronic device, and/or a second connector hole (for example, an earphone jack) 109 capable of containing a connector for transmitting/receiving an audio signal to/from the external electronic device.

Figure 2:
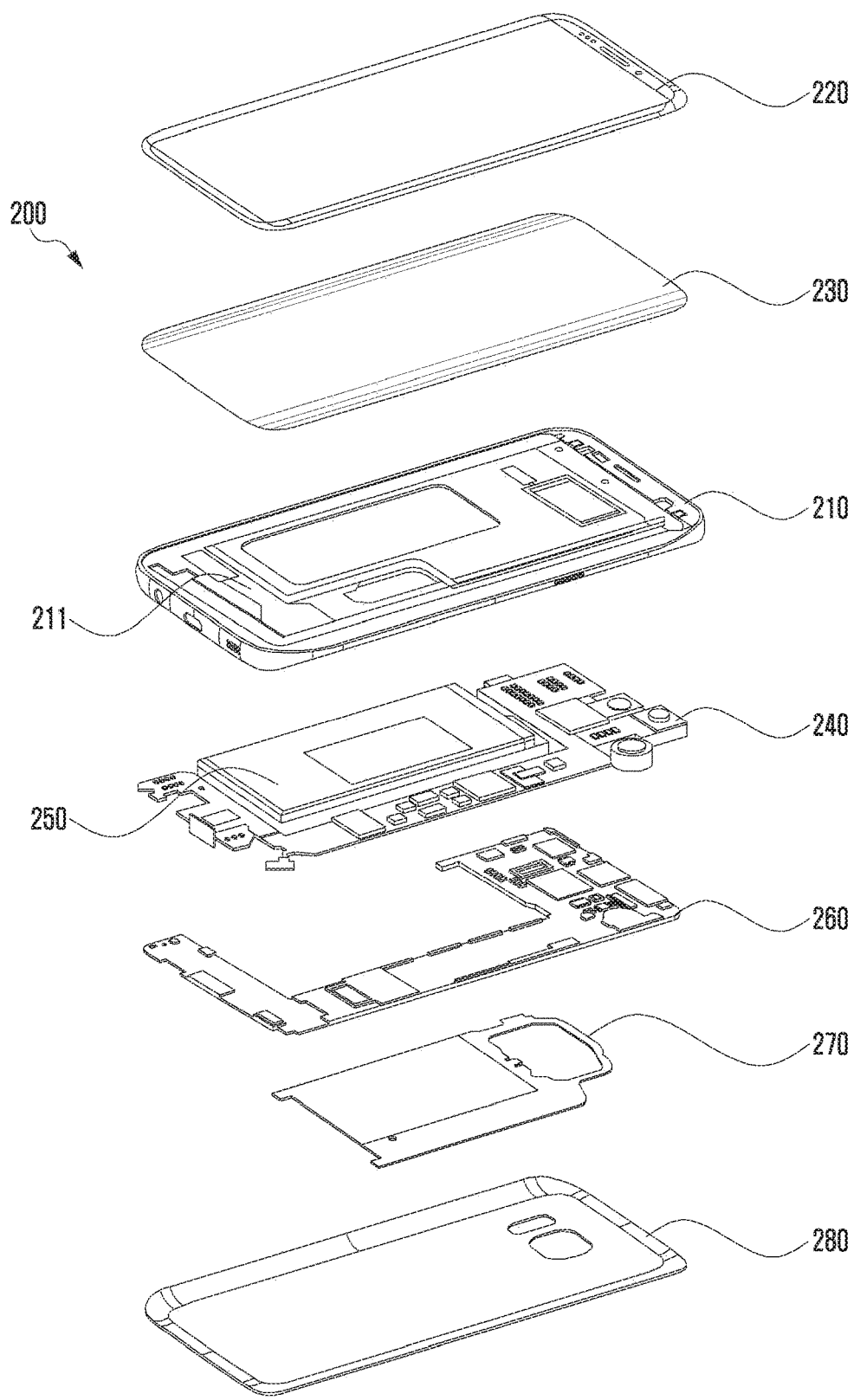
FIG. 2 is a developed perspective view of the electronic device of FIG. 1A according to an embodiment of the disclosure.

FIG. 2 is a developed perspective view of the electronic device of FIG. 1A according to an embodiment of the disclosure.

Referring to FIG. 2, the electronic device 200 may include a side bezel structure 210, a first support member 211 (for example, a bracket), a front plate 220, a display 230, a printed circuit board 240, a battery 250, a second support member 260 (for example, a rear case), an antenna 270, and a rear plate 280. In some embodiments, at least one of the constituent elements (for example, the first support member 211 or the second support member 260) of the electronic device 200 may be omitted, or the electronic device 200 may further include another constituent element. At least one of the constituent elements of the electronic device 200 may be identical or similar to at least one of the constituent elements of the electronic device 100 of FIG. 1A or FIG. 1B, and repeated descriptions thereof will be omitted herein.

The first support member 211 may be arranged inside the electronic device 200 and connected to the side bezel structure 210, or may be formed integrally with the side bezel structure 210. The first support member 211 may be made of a metal material and/or a nonmetal (for example, polymer) material, for example. The display 230 may be coupled to one surface of the first support member 211, and the printed circuit board 240 may be coupled to the other surface thereof. A processor, a memory, and/or an interface may be mounted on the printed circuit board 240. The processor may include, for example, one or more of a central processing device, an application processor (AP), a graphic processing device, an image signal processor (ISP), a sensor hub processor, or a communication processor (CP).

The memory may include a volatile memory or a non-volatile memory, for example.

The interface may include, for example, a high definition multimedia interface (HDMI), a universal serial bus (USB) interface, a secure digital (SD) card interface, and/or an audio interface. The interface may connect the electronic device 200 with an external electronic device electrically or physically, for example, and may include a USB connector, an SD card/MMC connector, or an audio connector.

The battery 250 is a device for supplying power to at least one constituent element of the electronic device 300, and may include a non-rechargeable primary cell, a rechargeable secondary cell, or a fuel cell, for example. At least a part of the battery 250 may be arranged on substantially the same plane with the printed circuit board 240, for example. The battery 250 may be arranged integrally inside the electronic device 200, or may be arranged such that the same can be attached to/detached from the electronic device 200.

The antenna 270 may be arranged between the rear plate 280 and the battery 250. The antenna 270 may include, for example, a near field communication (NFC) antenna, a wireless charging antenna, and/or a magnetic secure transmission (MST) antenna. The antenna 270 may conduct near-field communication with an external device or may wirelessly transmit/receive power necessary for charging, for example. In another embodiment, an antenna structure may be formed by a part or a combination of the side bezel structure 210 and/or the first support member 211.

In an electronic device according to various embodiments, at least one sensor electrode or sensor element for sensing pressure may be formed using a wiring layer included in a printed circuit board (PCB) 240. The electronic device may include at least one electrode pattern or sensor element for sensing pressure in the same layer as that of an uppermost wiring layer or a lowermost wiring layer constituting the PCB 240. At least one electrode pattern or sensor element for sensing pressure may be arranged to correspond to an arrangement position of a main button of the electronic device.

In an electronic device according to various embodiments, as at least one electrode or sensor element for a pressure sensor is implemented in the same layer as that of a wiring layer included in a PCB, and the pressure sensor (module) may be implemented integrally with the PCB. Hereinafter, a PCB will be described in which an electrode pattern for sensing pressure is arranged.

Figure 3:
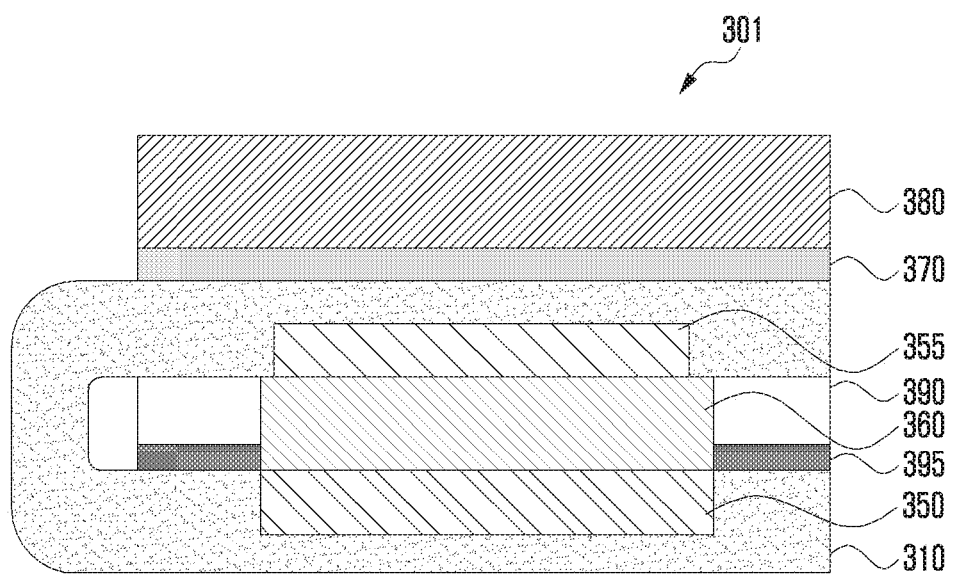
FIG. 3 is a cross-sectional view illustrating a printed circuit board (PCB) in which a pressure sensor of an electronic device is arranged according to an embodiment of the disclosure.

FIG. 3 is a cross-sectional view illustrating a PCB in which a pressure sensor of an electronic device is arranged according to an embodiment of the disclosure.

Referring to FIG. 3, according to an embodiment, in an electronic device 301 (e.g., the electronic device 100 of FIG. 1A, and the electronic device 200 of FIG. 2), a first electrode pattern 350 for sensing pressure may be arranged in the same layer as that of a wiring layer included in a PCB 310 (e.g., the PCB of FIG. 2) including at least one element or circuit pattern for driving the electronic device, an elastic layer 360 may be arranged on a region of the PCB 310 in which the first electrode pattern 350 is arranged, and a second electrode pattern 355 may be arranged on the elastic layer 360. The second electrode pattern 355 may also be arranged in the same layer as that of a wiring layer included in the PCB 310. The first electrode pattern 350 and the second electrode pattern 355 may be a capacitive type of pressure sensor electrode, but the disclosure is not limited thereto.

According to an embodiment, a PCB 310 in which the first electrode pattern 350 is arranged and a PCB 310 in which the second electrode pattern 355 is arranged may be one board. The PCB 310 may be formed in a flexible printed circuit board (FPCB). The FPCB 310 may be implemented with a plastic material or a polymer film that may be deformed, but a material of the FPCB 310 is not limited thereto and the FPCB 310 may be made of various materials.

According to an embodiment, a region of the PCB 310 in which the first electrode pattern 350 is arranged and a region of the PCB 310 in which the second electrode pattern 355 is arranged may be formed in a stacking structure folded to face each other.

According to another embodiment, the first electrode pattern 350 may be arranged in the PCB 310, the second electrode pattern 355 may be arranged in the FPCB electrically connected to the main board, and the FPCB may be formed in a stacked structure in the main circuit board by folding.

In the PCB 310, in a region other than a region in which the first electrode pattern 350 or the second electrode pattern 355 is arranged, an element or a circuit pattern for driving the electronic device 301 may be mounted or arranged. The PCB 310 may include a pressure sensor circuit (not illustrated) to which the first electrode pattern 350 or the second electrode pattern 355 is electrically connected. The PCB 310 may include a wiring structure (not illustrated) that may electrically connect the pressure sensor circuit and the first electrode pattern 350 or the second electrode pattern 355.

In a process of printing the circuit pattern or the element for driving the electronic device 301 in the PCB 310, the first electrode pattern 350 or the second electrode pattern 355 may be arranged. The first electrode pattern 350 or the second electrode pattern 355 may be a pattern formed in the same layer as that of an uppermost wiring layer or a lowermost wiring layer among a plurality of layers constituting the PCB 310.

The elastic layer 360 may be made of a material whose thickness changes according to pressure applied from the outside. While elasticity of the elastic layer 360 is deformed/recovered by an external pressure, a gap d between the first electrode pattern 350 and the second electrode pattern 355 may be changed.

The first electrode pattern 350 and the second electrode pattern 355 may detect the change in capacitance according to a gap change of the elastic layer 360 and transfer a capacitance signal to the pressure sensor circuit IC that calculates a pressure value (Z value).

According to an embodiment, in order to detect a pressure value, the pressure sensor circuit may apply a reference voltage to one of the first electrode pattern 350 and the second electrode pattern 355 and measure a signal transferred from the other one of the first electrode pattern 350 and the second electrode pattern 355 to calculate a pressure value.

According to another embodiment, the electronic device 301 may implement any one of the first electrode pattern 350 and the second electrode pattern 355 into the ground and detect a change in capacitance through the other one.

In the embodiment of the disclosure, the first electrode pattern 350 and the second electrode pattern 355 are arranged in a structure opposite to each other about the elastic layer 360, but the disclosure is not limited thereto and may be implemented in a structure in which the first electrode pattern 350 and the second electrode pattern 355 are spaced apart by a predetermined distance in parallel and then in which an elastic layer is stacked on a region in which the first electrode pattern 350 and the second electrode pattern 355 are arranged.

According to an embodiment, a spacer 390 for supporting the elastic layer may be arranged outside the elastic layer 360 arranged in a region of the PCB 310 in which the first electrode pattern 350 is arranged. The spacer 390 may perform a function of supporting between a region of the PCB 310 in which the first electrode pattern 350 is arranged and a region of the PCB 310 in which the second electrode pattern 355 is arranged.

An adhesive layer 395 may be arranged between the spacer 390 and a region of the PCB 310 in which the first electrode pattern 350 is not arranged. The adhesive layer 395 may perform a function of attaching the PCB 310 and the spacer 390.

Although not illustrated in FIG. 3, an adhesive layer may be arranged between the spacer 390 and the PCB 310 in which the second electrode pattern 355 is arranged. For example, after an adhesive layer is formed between the spacer 390 and a region of the PCB 310 in which the second electrode pattern 355 is not arranged, the PCB may be folded to be opposite to the first electrode pattern 350.

On a structure in which the PCB 310 in which the first electrode pattern 350 is arranged and the PCB 310 in which the second electrode pattern 355 is arranged are stacked by folding, a ground layer 370 and a display panel 380 may be stacked. Although not illustrated in FIG. 3, a touch panel (not illustrated) may be stacked on the display panel 380.

Figure 4:
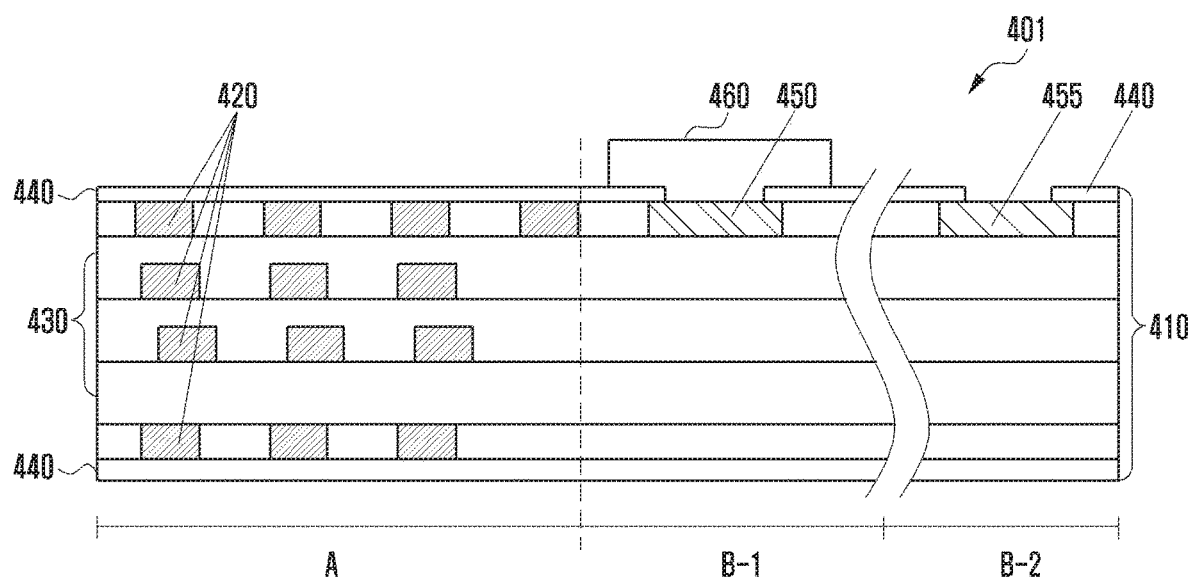
FIG. 4 is a cross-sectional view illustrating a PCB in which pressure sensors of an electronic device are arranged according to an embodiment of the disclosure.

FIG. 4 is a cross-sectional view illustrating a PCB in which pressure sensors of an electronic device are arranged according to an embodiment of the disclosure.

Referring to FIG. 4, a PCB 410 (e.g., the second circuit board 240 of FIG. 2, the PCB 310 of FIG. 3) according to various embodiments may include a first region A in which at least one element or circuit pattern for driving an electronic device 401 (e.g., the electronic device 100 of FIG. 1A, the electronic device 200 of FIG. 2, the electronic device 301 of FIG. 3) is formed, a second region (B-1) in which a first electrode pattern 450 (e.g., the first electrode pattern 350 of FIG. 3) is arranged, and a third region (B-2) in which a second electrode pattern 455 (e.g., the second electrode pattern 355 of FIG. 3) is arranged. In an example, the second region (B-1) and the third region (B-2) may be the same FPCB or the first region A and the second regions (B-1) may be a main board and the third region (B-2) may be a FPCB connected to the main board.

In the electronic device according to an embodiment, after PCBs of the second region (B-1) and the third region (B-2) are stacked by folding, components such as a display panel (e.g., the display panel 380 of FIG. 3) or a touch panel may be stacked.

The PCB 410 may have a multilayer structure in which a wiring layer 420 including at least one element or circuit pattern and a dielectric layer 430 are stacked alternately. In the first region A of the PCB 410, at least one element or circuit pattern for driving the electronic device 401 may be mounted or arranged. For example, in the first region A, a pressure sensor circuit electrically connected to a first electrode pattern 450 or the second electrode pattern 455 for sensing pressure and a processor for controlling a display panel or a touch panel may be arranged. Although not illustrated in FIG. 4, at least one element or circuit pattern for driving the electronic device 401 may be electrically connected through a wiring structure (not illustrated) formed in the PCB 410.

According to an embodiment, upon patterning an uppermost wiring layer or a lowermost wiring layer of the PCB 410, the first electrode pattern 450 and the second electrode pattern 455 may be patterned or formed in the PCB 410. For example, the first electrode pattern 450 and the second electrode pattern 455 may include a coil portion formed in a matrix structure by applying a screen-printing technique.

The first electrode pattern 450 and the second electrode pattern 455 may include at least one of indium-tin-oxide (ITO), indium-zinc-oxide (IZO), poly(3,4-ethylenedioxythiophene) polystyrene sulfonate (PEDOT), an Ag nanowire, a metal mesh, graphene, or transparent polymer conductor, but a material of the first electrode pattern 450 and the second electrode pattern 455 is not limited thereto and the first electrode pattern 450 and the second electrode pattern 455 may be made of a material in which a current may flow. In another embodiment, the first electrode pattern 450 and the second electrode pattern 455 is made of a transparent conductive material and may include at least one of silver (Ag), copper (Cu), magnesium (Mg), titanium (Ti), molybdenum (Mo), aluminum (Al), or graphene.

On a lowermost layer and an uppermost layer of the PCB 410, a cover barrier layer 440 for protecting the PCB 410 may be arranged.

According to an embodiment, after the uppermost wiring layer or the lowermost wiring layer is patterned, by etching a coated cover barrier layer 440, the first electrode pattern 450 and the second electrode pattern 455 may be exposed.

An elastic layer 460 may be arranged on a region of the PCB 410 in which the first electrode pattern 450 is exposed. The elastic layer 460 may be made of a material having a changing thickness according to pressure applied from the outside to have an elastic force or a restoring force. For example, the elastic layer 460 may be a dielectric layer including at least one material of silicon, foam, membrane, optically clear adhesive (OCA), sponge, rubber, ink, or polymer, but the disclosure is not limited thereto.

After the elastic layer 460 is arranged, the second region (B-1) and the third region (B-2) are folded; thus, the PCB 410 may be formed in a structure of FIG. 3.

In the electronic device 401 according to various embodiments, by arranging an electrode for sensing pressure in the same layer as that of the wiring layer included in the PCB 410, a pressure sensor module integrally formed with the PCB 410 may be implemented. Hereinafter, various arrangement structures of the pressure sensor electrode will be descried.

Figure 5A:
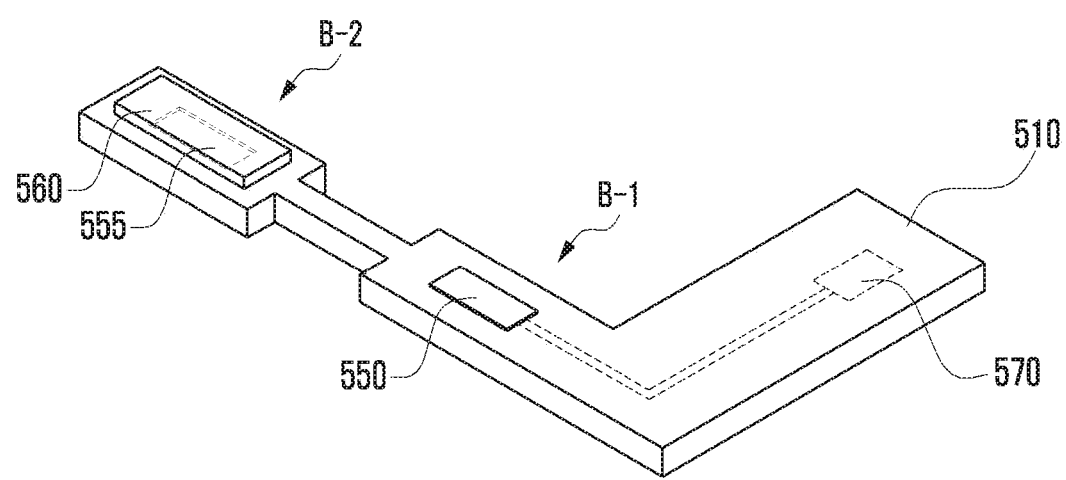
FIG. 5A is a diagram illustrating an arrangement structure of a pressure sensor electrode of an electronic device according to an embodiment of the disclosure.
Figure 5B:
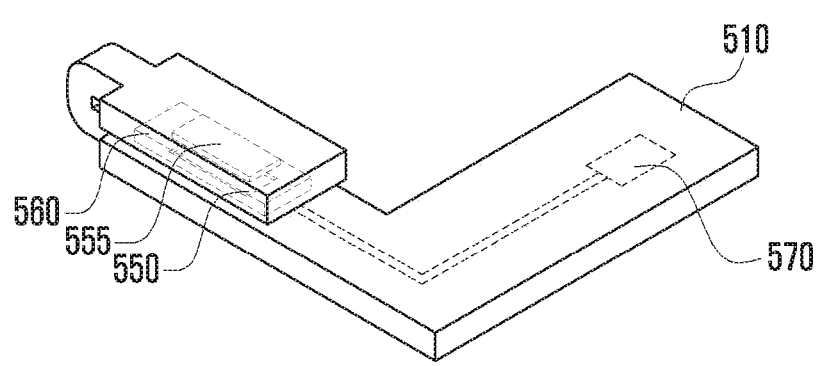
FIG. 5B illustrates a structure in which the third region (B-2) is stacked in the second region (B-1) by folding in FIG. 5A according to an embodiment of the disclosure.

FIG. 5A is a diagram illustrating an arrangement structure of a pressure sensor electrode of an electronic device according to an embodiment of the disclosure. FIG. 5B is a diagram illustrating an arrangement structure of a pressure sensor electrode of an electronic device according to an embodiment of the disclosure.

Referring to FIGS. 5A and 5B, according to an embodiment, in an electronic device 501 (e.g., the electronic device 100 of FIG. 1A, the electronic device 200 of FIG. 2, the electronic device 301 of FIG. 3, and the electronic device 401 FIG. 4), by arranging one electrode pattern in a PCB 510 (e.g., the PCB 240 of FIG. 2, the PCB 310 of FIG. 3, and the PCB 410 of FIG. 4), one input channel corresponding to a pressure signal may be formed.

Unlike the first region (e.g., the first region A of FIG. 4) in which a pressure sensor circuit 570 is arranged in the PCB 510, a first electrode pattern 550 may be arranged in a second region (B-1) of a wiring layer included in the PCB 510, and a second electrode pattern 555 may be arranged in a third region (B-2). For convenience of description, a form of the PCB 510 of FIG. 5A is illustrated and the disclosure is not limited thereto. The second region (B-1) in which the first electrode pattern 550 is arranged and the third region (B-2) in which the second electrode pattern 555 is arranged may be connected to each other, and a connected structure is not limited to a form of FIGS. 5A and 5B.

In a state in which the first electrode pattern 550 and the second electrode pattern 555 are exposed, an elastic layer 560 may be arranged. It is illustrated that the elastic layer 560 is arranged in the third region (B-2) in which the second electrode pattern 555 is arranged, but the elastic layer 560 may be arranged in the second region (B-1) in which the first electrode pattern 550 is arranged instead of the third region (B-2). Although not illustrated in FIG. 5A, a spacer (e.g., the spacer 390 of FIG. 3) and an adhesive layer (e.g., the adhesive layer 395 of FIG. 3) may be arranged in the form enclosing the elastic layer 560; and, in the PCB 510, a wiring structure may be formed in which the first electrode pattern 550 and the second electrode pattern 555 are electrically connected to the pressure sensor circuit 570. For convenience of description, as shown in FIG. 5A, only a wiring connected to the first electrode pattern 550 is illustrated in a dotted line, but a wiring structure for connecting to the second electrode pattern 555 and the pressure sensor circuit 570 may be formed.

FIG. 5B illustrates a structure in which the third region (B-2) is stacked in the second region (B-1) by folding in FIG. 5A; and, as illustrated in FIG. 5B, when the third region (B-2) is folded, the first electrode pattern 550 and the second electrode pattern 555 may be spaced apart from each other by the elastic layer to face each other. As in a structure illustrated in FIG. 5B, a stacked structure of the first electrode pattern 550, the elastic layer 560, and the second electrode pattern 555 may be used as a pressure sensor.

The pressure sensor circuit 570 may apply a voltage to one of the first electrode pattern 550 and the second electrode pattern 555, detect a change in capacitance formed between the first electrode pattern 550 and the second electrode pattern 555 by the applied voltage, and calculate a pressure value based on the change in capacitance. The pressure sensor circuit 570 may calculate a change (speed) in the pressure intensity changed during a unit time and a direction in which the pressure is applied. The pressure sensor circuit 570 may transfer at least one of a pressure Z, strength of the pressure, speed, direction, or position (X, Y) information in which a touch is made to a processor arranged within the PCB 510.

Figure 6A:
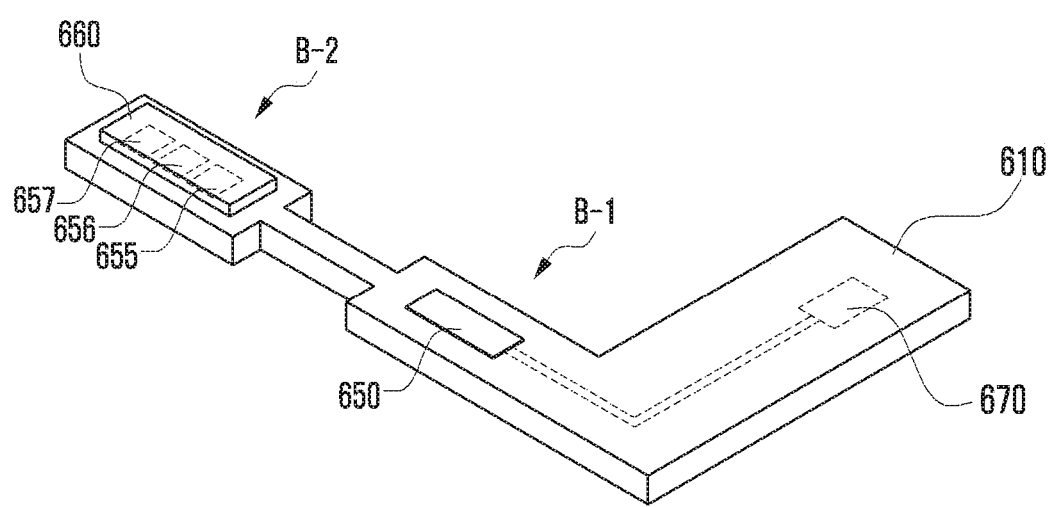
FIG. 6A is a diagram illustrating an arrangement structure of a pressure sensor electrode of an electronic device according to an embodiment of the disclosure.
Figure 6B:
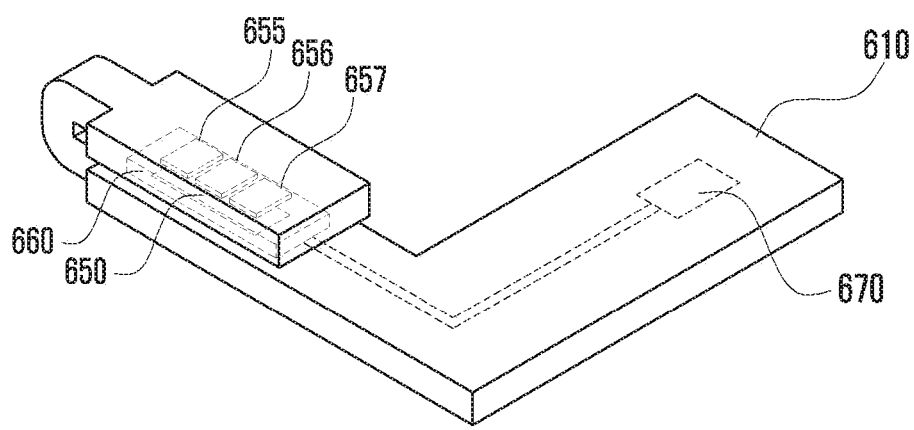
FIG. 6B is a diagram illustrating an arrangement structure of a pressure sensor electrode of an electronic device according to an embodiment of the disclosure.

FIG. 6A is a diagram illustrating an arrangement structure of a pressure sensor electrode of an electronic device according to an embodiment of the disclosure. FIG. 6B is a diagram illustrating an arrangement structure of a pressure sensor electrode of an electronic device according to an embodiment of the disclosure.

Referring to FIGS. 6A and 6B, in an electronic device 601 (e.g., the electronic device 100 of FIG. 1A, the electronic device 200 of FIG. 2, the electronic device 301 of FIG. 3, and the electronic device 401 of FIG. 4) according to an embodiment, by arranging three electrode patterns in a PCB 610 (e.g., the PCB 240 of FIG. 2, the PCB 310 of FIG. 3, and the PCB 410 of FIG. 4), three input channels corresponding to a pressure signal may be formed.

Unlike a first region (e.g., the first region A of FIG. 4) in which a pressure sensor circuit 670 is arranged in the PCB 610, one first electrode pattern 650 may be arranged in a second region (B-1), and three second electrode patterns 655, 656, and 657 may be arranged in a third region (B-2). For example, the first electrode pattern 650 may be a transmitting electrode in which a reference voltage is applied by the pressure sensor circuit 670 and may be a receiving electrode that transfers a change amount in capacitance of the second electrode patterns 655, 656, and 657 to the pressure sensor circuit 670, but the disclosure is not limited thereto.

In a state in which the first electrode pattern 650 and the second electrode patterns 655, 656, and 657 are exposed, an elastic layer 660 may be arranged, and the elastic layer 660 may be arranged in the second region (B-1) in which the first electrode pattern 650 is arranged instead of in the third region (B-2). Although not illustrated in FIG. 6A, a spacer (e.g., the spacer 390 of FIG. 3) and an adhesive layer (e.g., the adhesive layer 395 of FIG. 3) may be arranged in the form enclosing the elastic layer 660.

When the third region (B-2) is stacked in the second region (B-1) by folding as illustrated in FIG. 6A, the first electrode pattern 650 and the second electrode patterns 655, 656, and 657 may be spaced apart from each other by the elastic layer 660 to be opposite to each other, as illustrated in FIG. 6B. As in the structure illustrated in FIG. 6B, a stacked structure of the first electrode pattern 650, the elastic layer 660, and the second electrode patterns 655, 656, and 657 may be used as a pressure sensor. Each of the second electrode patterns 655, 656, and 657 may be independently electrically connected to the pressure sensor circuit 670; and, for convenience of description, each of the second electrode patterns 655, 656, and 657 omits wiring structures independently connected to the pressure sensor circuit 670. As each of the second electrode patterns operates divided by one input signal, the electronic device may form three input channels in response to the pressure signal.

According to another embodiment, by arranging three first electrode patterns 650 in the second region (B-1) of the PCB 610 and arranging one second electrode pattern 655 in the third region (B-1), three input channels may be implemented.

Figure 7:
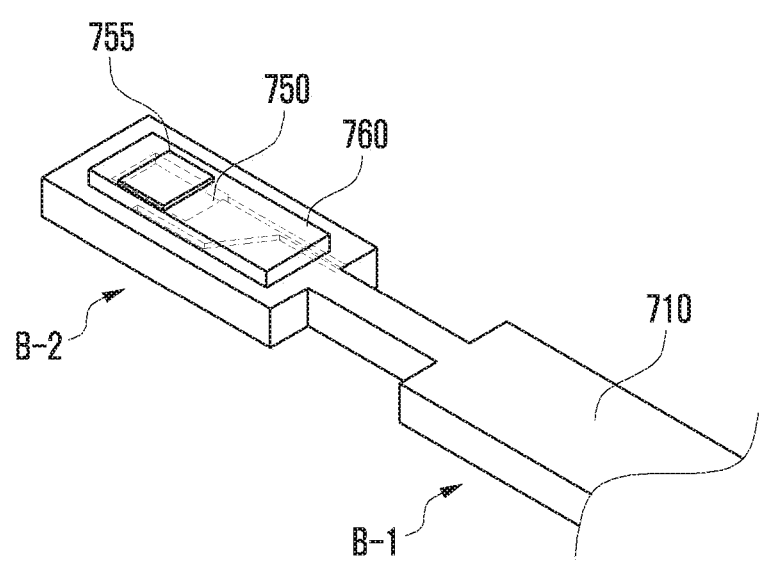
FIG. 7 is a diagram illustrating an arrangement structure of a pressure sensor electrode of an electronic device according to an embodiment of the disclosure.

FIG. 7 is a diagram illustrating an arrangement structure of a pressure sensor electrode of an electronic device according to an embodiment of the disclosure. The PCB illustrated in FIG. 7 illustrates only a region in which the pressure sensor electrode is arranged that is other than a region in which the element or the circuit pattern for driving the electronic device is arranged.

Referring to FIG. 7, an electronic device 701 (e.g., the electronic device 100 of FIG. 1A, the electronic device 200 of FIG. 2, the electronic device 301 of FIG. 3, and the electronic device 401 of FIG. 4) according to an embodiment may arrange a first electrode pattern 750 in the same layer as that of the wiring layer included in a PCB 710 (e.g., the PCB 240 of FIG. 2, the PCB 310 of FIG. 3, and the PCB 410 of FIG. 4) and form a structure in which an elastic layer 760 and a second electrode pattern 755 are stacked on a region in which the first electrode pattern 750 is arranged to form one input channel corresponding to a pressure signal.

In one region (e.g., B-2) of the PCB 710 of FIG. 7, the first electrode pattern 750 may be arranged in the same layer as that of an uppermost wiring layer of the PCB 710, the elastic layer 760 may be stacked in a state in which the first electrode pattern 750 is exposed, and the second electrode pattern 755 may be stacked on the elastic layer 760. By folding one region (B-1) of the PCB 710 in which the elastic layer 760 and the second electrode pattern 755 are stacked and stacking the one region (B-1) in the PCB 710 on another region (B-2), a pressure sensor module may be implemented in the PCB 710. Although not illustrated in FIG. 7, in the PCB 710, a wiring structure may be implemented in which the first electrode pattern 750 and the second electrode pattern 755 are electrically connected to a pressure sensor circuit, and the wiring structure is omitted for convenience of description. Further, a spacer (e.g., the spacer 390 of FIG. 3) and an adhesive layer (e.g., the adhesive layer 395 of FIG. 3) may be arranged in the form enclosing the elastic layer 760.

Figure 8:
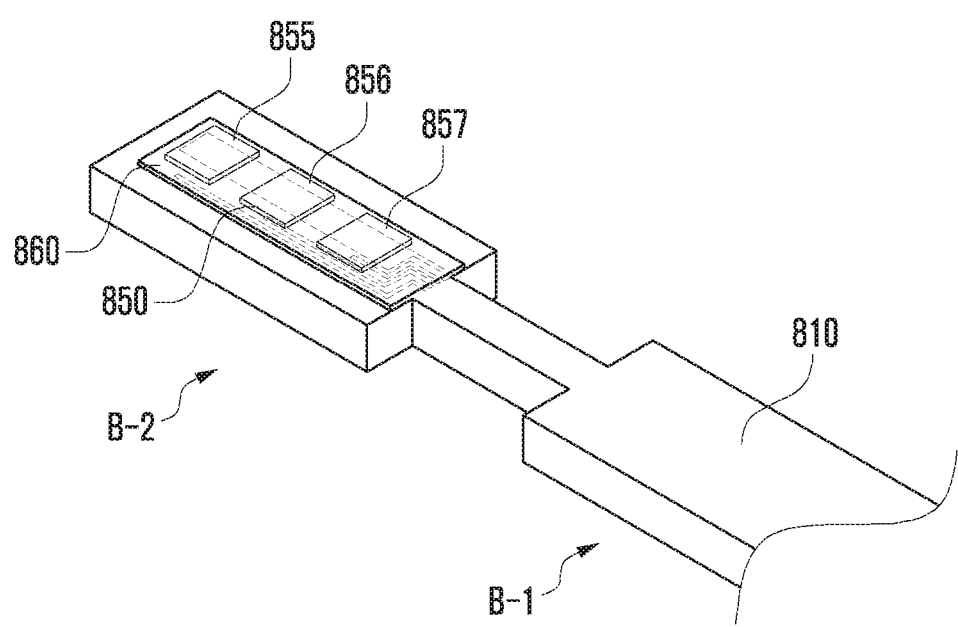
FIG. 8 is a diagram illustrating an arrangement structure of a pressure sensor electrode of an electronic device according to an embodiment of the disclosure.
Figure 9:
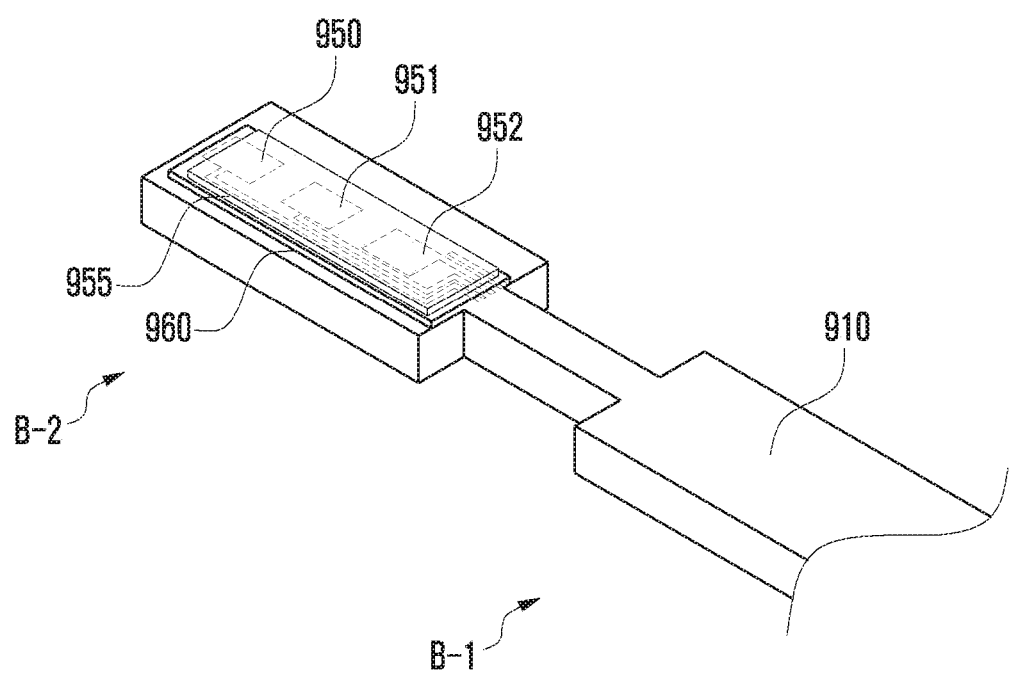
FIG. 9 is a diagram illustrating an arrangement structure of a pressure sensor electrode of an electronic device according to an embodiment of the disclosure.

FIG. 8 is a diagram illustrating an arrangement structure of a pressure sensor electrode of an electronic device according to an embodiment of the disclosure. FIG. 9 is a diagram illustrating an arrangement structure of a pressure sensor electrode of an electronic device according to an embodiment of the disclosure.

Referring to FIGS. 8 and 9, electronic devices 801 and 901 (e.g., the electronic device 100 of FIG. 1A, the electronic device 200 of FIG. 2, the electronic device 301 of FIG. 3, and the electronic device 401 of FIG. 4) according to various embodiments may arrange a pressure sensor electrode in one region of a PCB to form an input channel corresponding to three pressure signals.

According to an embodiment, as illustrated in FIG. 8, in the electronic device 801, in order to implement three input channels to correspond to the pressure signal, a first electrode pattern 850 may be arranged in one region of a PCB 810 (e.g., the PCB 240 of FIG. 2, the PCB 310 of FIG. 3, and the PCB 410 of FIG. 4), and an elastic layer 860 and three second electrode patterns 855, 856, and 857 may be formed in a stacked structure on a region in which the first electrode pattern 850 is arranged.

In a region (B-1) of the PCB 810 of FIG. 8, the first electrode pattern 850 may be implemented in the same layer as that of an uppermost wiring layer of the PCB 810, and in a state in which the first electrode pattern 850 is exposed, the elastic layer 860 may be stacked, and three second electrode patterns 855, 856, and 857 may be stacked on the elastic layer 860. For example, the first electrode pattern 850 may be formed in a size that may correspond to a size of three second electrode patterns 855, 856, and 857.

According to another embodiment, as illustrated in FIG. 9, in a region (B-1) of a PCB 910, three first electrode patterns 950, 951, and 952 may be arranged, an elastic layer 960 may be arranged on a region in which the first electrode pattern 950 is arranged, and a second electrode pattern 955 may be formed in a stacked structure on the elastic layer 960. In a region (B-1) of the PCB 910 of FIG. 9, three first electrode patterns 950, 951, and 952 are implemented in the same layer as that of an uppermost wiring layer of the PCB 910; and, in a state in which three first electrode patterns 950, 951, and 952 are exposed, the elastic layer 960 may be stacked, and the second electrode patterns 955 may be stacked on the elastic layer 960. For example, the second electrode pattern 955 may be formed in a size that may correspond to a size of three first electrode patterns 950, 951, and 952.

Although not illustrated in FIGS. 8 and 9, in the PCBs 810 and 910 of FIGS. 8 and 9 a wiring structure in which the electrode patterns and the pressure sensor circuit are electrically connected may be implemented and is omitted for convenience of description. Further, a spacer (e.g., the spacer 390 of FIG. 3) and an adhesive layer (e.g., the adhesive layer 395 of FIG. 3) may be arranged in the form enclosing the elastic layers 860 and 960.

In the electronic device according to various embodiments, by folding one region (B-1) of the PCBs 810 and 910 illustrated in FIGS. 8 and 9 and stacking the one region (B-1) in the PCBs 810 and 910 on another region (B-2), the PCBs 810 and 910 formed integrally with a pressure sensor module having three input channels may be implemented.

An electronic device (e.g., the electronic device 100 of FIG. 1A, the electronic device 200 of FIG. 2, the electronic device 301 of FIG. 3, the electronic device 401 of FIG. 4, the electronic device 501 of FIGS. 5A and 5B, the electronic device 601 of FIGS. 6A and 6B, the electronic device 701 of FIG. 7, the electronic device 801 of FIG. 8, and the electronic device 901 of FIG. 9) according to various embodiments may include a PCB (e.g., the PCB 210 of FIG. 2, the PCB 310 of FIG. 3, the PCB 410 of FIG. 4, the PCB 510 of FIGS. 5A and 5B, the PCB 610 of FIGS. 6A and 6B, the PCB 710 of FIG. 7, the PCB 810 of FIG. 8, and the PCB 910 of FIG. 9) including at least one element or circuit pattern for driving the electronic device, at least one electrode pattern (e.g., the first electrode pattern 350 of FIG. 3, the first electrode pattern 450 of FIG. 4, the first electrode pattern 550 of FIGS. 5A and 5B, the first electrode pattern 650 of FIGS. 6A and 6B, the first electrode pattern 750 of FIG. 7, the first electrode pattern 850 of FIG. 8, and the PCB 910 of FIG. 9) formed to detect pressure in the wiring layer included in the PCB, an elastic member (e.g., the elastic layer 360 of FIG. 3, the elastic layer 460 of FIG. 4, the elastic layer 560 of FIGS. 5A and 5B, the elastic layer 660 of FIGS. 6A and 6B, the elastic layer 760 of FIG. 7, the elastic layer 860 of FIG. 8, and the elastic layer 960 of FIG. 9) arranged to be at least partially overlapped with the electrode pattern, and a pressure sensor circuit (e.g., the pressure sensor circuit 570 of FIGS. 5A and 5B, and the pressure sensor circuit 670 of FIGS. 6A and 6B) electrically connected to the electrode pattern included in the PCB and for applying a voltage to the electrode pattern and for measuring the intensity of the pressure based on a change in a voltage applied to the electrode pattern.

The electronic device may further include the other electrode pattern (e.g., the second electrode pattern 355 of FIG. 3, the second electrode pattern 455 of FIG. 4, the second electrode pattern 555 of FIGS. 5A and 5B, the second electrode pattern 655 of FIGS. 6A and 6B, the second electrode pattern 755 of FIG. 7, the second electrode pattern 855 of FIG. 8, and the second electrode pattern 955 of FIG. 9) arranged at a position corresponding to the electrode pattern on the elastic member.

The PCB is an FPCB, and the other electrode pattern may be formed using a wiring layer of a position at least partially overlapped with a region of the PCB including the electrode pattern.

A region of the PCB including the electrode pattern and a region of the PCB in which the other electrode pattern is formed may be arranged in a structure folded so that they face each other.

On a PCB of a structure in which the electrode pattern and the other electrode pattern are folded, at least one of a ground layer (e.g., the ground layer 380 of FIG. 3), a display panel (e.g., the display panel 380 of FIG. 3), or a touch panel may be stacked.

The electrode device may include a spacer (the spacer 390 of FIG. 3) enclosing an outer edge of the elastic member between a region of the PCB including the electrode pattern and a region of the PCB including the second electrode pattern.

Any one of the electrode patterns and the other electrode pattern may be connected as a ground layer, and the pressure sensor circuit may be formed to receive a change in the capacitance through the other one electrode pattern.

The electrode pattern or the other electrode pattern may be formed based on an uppermost wiring layer or a lowermost wiring layer of the PCB.

The electrode pattern or the other electrode pattern may be arranged in the same wiring layer as that of an uppermost wiring layer of the PCB.

The electrode device may further include a cover layer arranged on an uppermost wiring layer or a lowermost wiring layer of the PCB, wherein when patterning the uppermost wiring layer or the lowermost wiring layer, the electrode pattern or the other electrode pattern may be implemented, a cover layer region may be exposed in which the electrode pattern or the other electrode pattern is formed, and the elastic member may be arranged on the exposed cover layer region.

The PCB may include a first region in which at least one element or circuit pattern for driving the electronic device is formed, a second region in which an electrode pattern is formed, and a third region in which the other electrode pattern is formed; and the second region and the third region may have a folded structure in the form facing each other.

When any one electrode of the electrode pattern and the other electrode pattern is formed in a three-channel pattern, the other electrode may be formed in a first-channel pattern.

The at least one electrode pattern may be a force sensing resistor (FSR) sensor electrode.

The pressure sensor circuit may detect an input signal based on a resistance value according to a contact area of the electrode pattern and the elastic member.

An electronic device (e.g., the electronic device 100 of FIG. 1A, the electronic device 200 of FIG. 2, the electronic device 301 of FIG. 3, the electronic device 401 of FIG. 4, the electronic device 501 of FIGS. 5A and 5B, the electronic device 601 of FIGS. 6A and 6B, the electronic device 701 of FIG. 7, the electronic device 801 of FIG. 8, and the electronic device 901 of FIG. 9) according to various embodiments includes a PCB (e.g., the PCB 210 of FIG. 2, the PCB 310 of FIG. 3, the PCB 410 of FIG. 4, the PCB 510 of FIGS. 5A and 5B, the printing circuit board 610 of FIGS. 6A and 6B, the PCB 710 of FIG. 7, the PCB 810 of FIG. 8, and the PCB 910 of FIG. 9) in which at least one element or circuit pattern for driving the electronic device is formed, at least one first electrode pattern (e.g., the first electrode pattern 350 of FIG. 3, the first electrode pattern 450 of FIG. 4, the first electrode pattern 550 of FIGS. 5A and 5B, the first electrode pattern 650 of FIGS. 6A and 6B, the first electrode pattern 750 of FIG. 7, the first electrode pattern 850 of FIG. 8, and the first electrode pattern 950 of FIG. 9) and second electrode pattern (e.g., second first electrode pattern 355 of FIG. 3, the second electrode pattern 455 of FIG. 4, the second electrode pattern 555 of FIGS. 5A and 5B, the second electrode pattern 655 of FIGS. 6A and 6B, the second electrode pattern 755 of FIG. 7, the second electrode pattern 855 of FIG. 8, and the second electrode pattern 955 of FIG. 9) formed to detect pressure in a wiring layer included in the PCB, an elastic member (e.g., the elastic layer 360 of FIG. 3, the elastic layer 460 of FIG. 4, the elastic layer 560 of FIGS. 5A and 5B, the elastic layer 660 of FIGS. 6A and 6B, the elastic layer 760 of FIG. 7, the elastic layer 860 of FIG. 8, and the elastic layer 960 of FIG. 9) arranged to be at least partially overlapped with the first electrode pattern and the second electrode pattern, and a pressure sensor circuit (e.g., the pressure sensor circuit 570 of FIGS. 5A and 5B and the pressure sensor circuit 670 of FIGS. 6A and 6B) electrically connected to the first electrode pattern included in the PCB and for applying a voltage to the first electrode pattern and for measuring intensity of the pressure based on the applied voltage change, wherein the PCB may be formed in a folded structure such that a region in which the first electrode pattern is formed and a region in which a second electrode pattern is formed are opposite to each other. The first electrode pattern or the second electrode pattern may be formed based on an uppermost wiring layer or a lowermost wiring layer of the PCB.

The first electrode pattern or the second electrode pattern may be arranged in the same wiring layer as that of an uppermost wiring layer of the PCB.

When any one electrode of the first electrode pattern and the second electrode pattern is formed in a three-channel pattern, the other electrode may be formed in a first-channel pattern.

Figure 10:
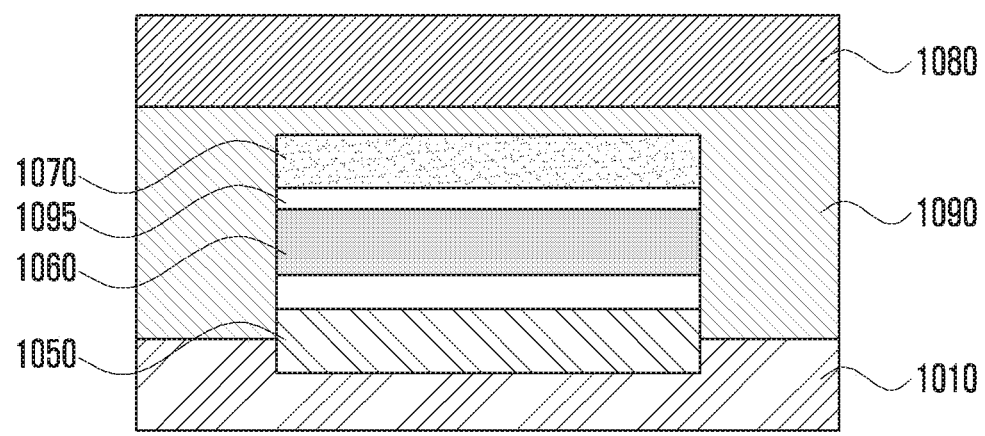
FIG. 10 is a cross-sectional view illustrating a PCB of an electronic device according to an embodiment of the disclosure.

FIG. 10 is a cross-sectional view illustrating a PCB of an electronic device according to an embodiment of the disclosure.

Referring to FIG. 10, in an electronic device (e.g., the electronic device 100 of FIG. 1A, and the electronic device 200 of FIG. 2) according to an embodiment, a resistance sensor small electrode (or element) 1050 may be arranged in an uppermost wiring layer of a PCB 1010 including at least one element or circuit pattern for driving the electronic device, and an elastic layer 1060 and a spacer layer 1090 may be formed in a stacked structure on the PCB 1010 in which a resistance sensor electrode 1050 is arranged. In an example, a folded FPCB 1070 and adhesive layer 1095 may be arranged between the elastic layer 1060 and the spacer layer 1090. A display panel 1080 may be stacked on the spacer layer 1090. According to an embodiment, the resistance sensor electrode 1050 may be a force sensing resistor (FSR) sensor electrode and the resistance sensor electrode 1050 is not limited thereto. The resistance sensor electrode 1050 may be an electrode formed in a semiconductor layer.

According to an embodiment, the resistance sensor electrode 1050 and the elastic layer 1060 may be stacked in a structure spaced apart by a predetermined interval by the spacer layer 1090. The elastic layer 1060 may be elastically deformed/restored by an external force. When there is no pressure, the resistance sensor electrode 1050 and the elastic layer 1060 do not contact each other, and when there is an external pressure, a contact area increases between the resistance sensor electrode 1050 and the elastic layer 1060; thus, a resistance value of the resistance sensor electrode 1050 may be changed.

The PCB 1010 may include a pressure sensor circuit (not illustrated) electrically connected to the resistance sensor electrode 1050. The resistance sensor electrode 1050 may transfer a resistance value signal according to a contact area with the elastic layer 1060 to the pressure sensor circuit. The pressure sensor circuit may calculate a resistance value signal according to a change in a z-axis to detect a pressure input.

Figure 11A:
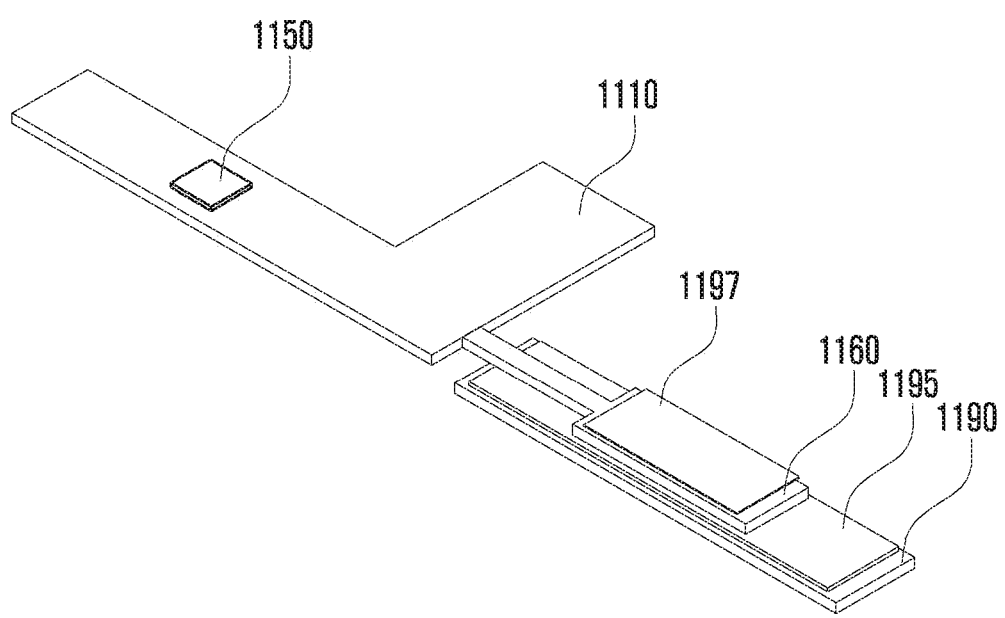
FIG. 11A illustrates an arrangement structure of a pressure sensor electrode of an electronic device according to an embodiment of the disclosure.
Figure 11B:
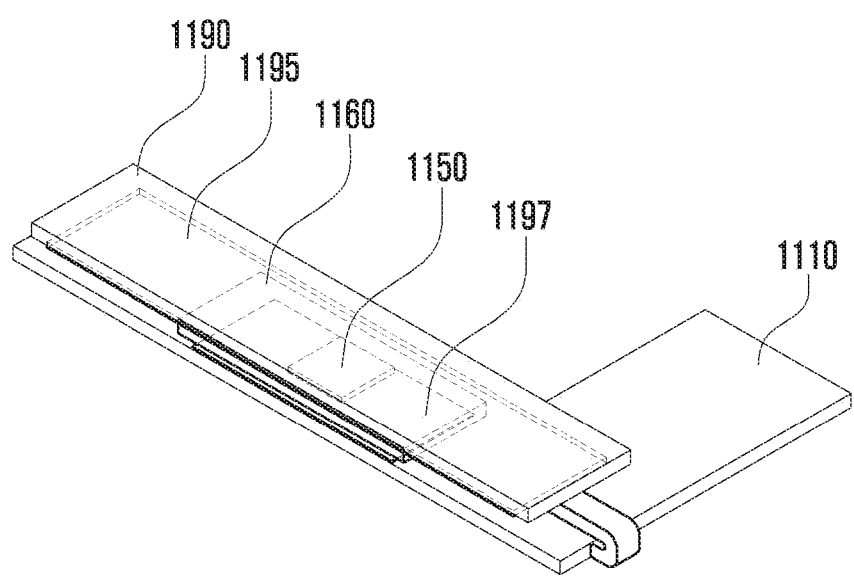
FIG. 11B illustrates an arrangement structure of a pressure sensor electrode of an electronic device according to an embodiment of the disclosure.

FIG. 11A illustrates an arrangement structure of a pressure sensor electrode of an electronic device according to an embodiment of the disclosure. FIG. 11B illustrates an arrangement structure of a pressure sensor electrode of an electronic device according to an embodiment of the disclosure.

Referring to FIGS. 11A and 11B, according to an embodiment, in an electronic device (e.g., the electronic device 100 of FIG. 1A, and the electronic device 200 of FIG. 2), by arranging a resistance sensor electrode 1150 (e.g., the resistance sensor electrode 1050 of FIG. 10) in the PCB 1110 (e.g., the PCB 1010 of FIG. 10), an input channel may be formed in an electronic device 1101 by a pressure signal.

According to various embodiments, as illustrated in FIG. 11A, in an uppermost layer of one region of the PCB 1110, the resistance sensor electrode 1150 may be arranged, a spacer layer 1190 and an adhesive layer 1195 may be stacked separately from the PCB 1110, and a PCB 1160 may be stacked that may be folded by being at least partially connected to the PCB 1110 in which the resistance sensor electrode 1150 is arranged on the adhesive layer 1195, and an elastic layer 1197 may be stacked. In a structure illustrated in FIG. 11A, by folding the PCB 1160 stacked with the elastic layer 1197 with the PCB 1110 in which the resistance sensor electrode 1150 is arranged, a stacking structure as illustrated in FIG. 11B may be implemented. In the structure illustrated of FIG. 11B, because the elastic layer 1197 and the resistance sensor electrode 1150 are arranged to face each other, the elastic layer 1197 and the resistance sensor electrode 1150 may be used as a pressure sensor. Although not illustrated in FIGS. 11A and 11B, for convenience of description, the PCB 1110 may be omitted and the PCB 1110 of FIGS. 11A and 11B may include a pressure sensor circuit (not illustrated) electrically connected to the resistance sensor electrode 1150 and a wiring structure (not illustrated) for the pressure sensor circuit. By detecting a signal according to the change in a resistance value of the resistance sensor electrode 1150, the pressure sensor circuit may detect a pressure signal.

Figure 12:
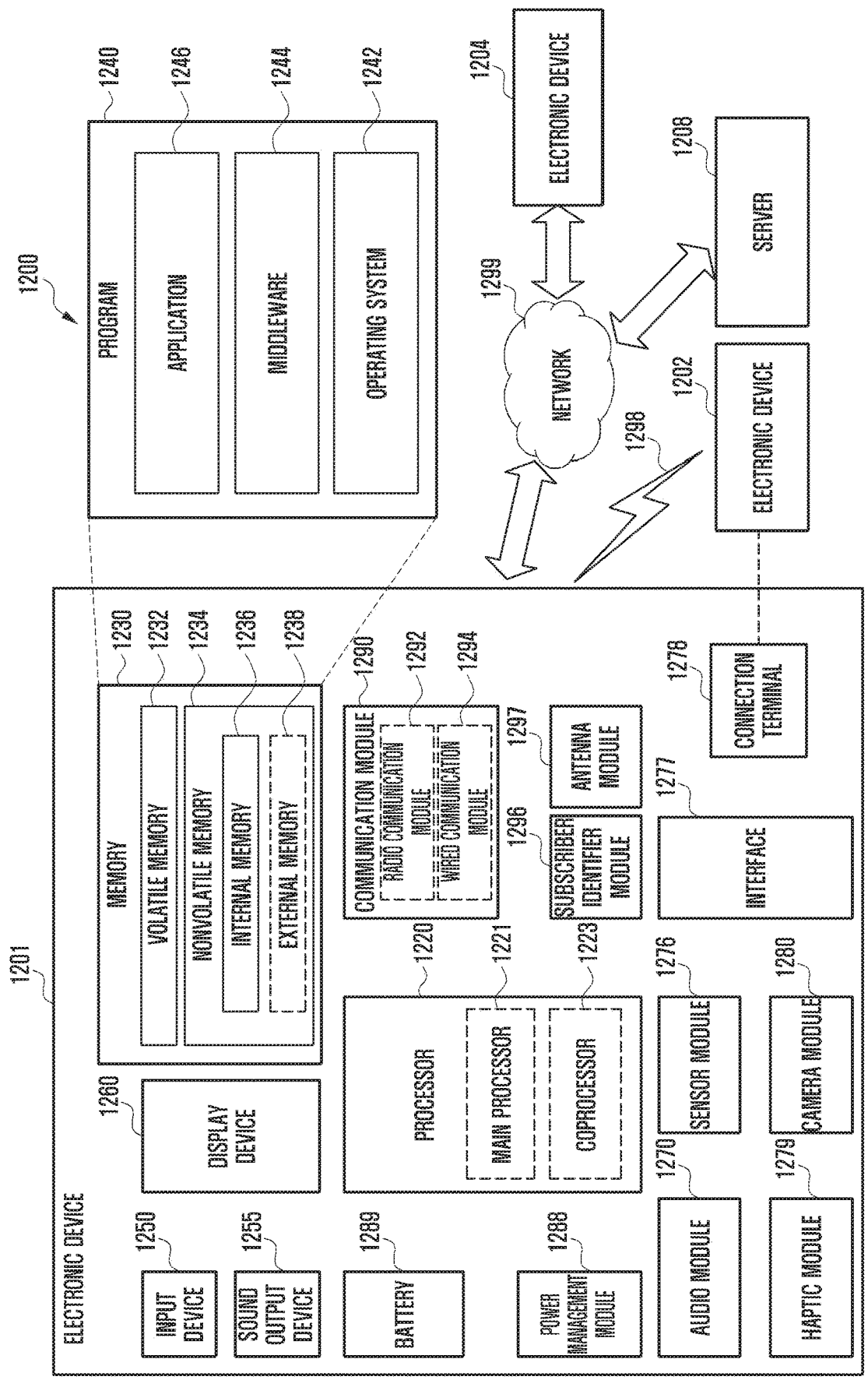
FIG. 12 is a block diagram illustrating an electronic device in a network environment according to an embodiment of the disclosure.

FIG. 12 is a block diagram illustrating an electronic device in a network environment according to an embodiment of the disclosure.

Referring to FIG. 12, the electronic device 1201 (e.g. the electronic device 100 in FIG. 1, the electronic device 200 in FIG. 2, the electronic device 301 in FIG. 3, the electronic device 401 in FIG. 4, the electronic device 501 in FIG. 5, the electronic device 601 in FIG. 6, the electronic device 701 in FIG. 7, the electronic device 801 in FIG. 8 and the electronic device 901 in FIG. 9) in the network environment 1200 may communicate with an electronic device 1202 via a first network 1298 (e.g., a short-range wireless communication network), or an electronic device 1204 or a server 1208 via a second network 1299 (e.g., a long-range wireless communication network).

According to an embodiment, the electronic device 1201 may communicate with the electronic device 1204 via the server 1208. According to an embodiment, the electronic device 1201 may include a processor 1220, memory 1230, an input device 1250, a sound output device 1255, a display device 1260, an audio module 1270, a sensor module 1276, an interface 1277, a haptic module 1279, a camera module 1280, a power management module 1288, a battery 1289, a communication module 1290, a subscriber identification module (SIM) 1296, or an antenna module 1297. In some embodiments, at least one (e.g., the display device 1260 or the camera module 1280) of the components may be omitted from the electronic device 1201, or one or more other components may be added in the electronic device 1201. In some embodiments, some of the components may be implemented as single integrated circuitry. For example, the sensor module 1276 (e.g., a fingerprint sensor, an iris sensor, or an illuminance sensor) may be implemented as embedded in the display device 1260 (e.g., a display).

The processor 1220 may execute, for example, software (e.g., a program 1240) to control at least one other component (e.g., a hardware or software component) of the electronic device 1201 coupled with the processor 1220, and may perform various data processing or computation. According to one embodiment, as at least part of the data processing or computation, the processor 1220 may load a command or data received from another component (e.g., the sensor module 1276 or the communication module 1290) in volatile memory 1232, process the command or the data stored in the volatile memory 1232, and store resulting data in non-volatile memory 1234 (e.g., internal memory 1236 and/or external memory 1238). According to an embodiment, the processor 1220 may include a main processor 1221 (e.g., a central processing unit (CPU) or an application processor (AP)), and an auxiliary processor 1223 (e.g., a graphics processing unit (GPU), an image signal processor (ISP), a sensor hub processor, or a communication processor (CP)) that is operable independently from, or in conjunction with, the main processor 1221. Additionally or alternatively, the auxiliary processor 1223 may be adapted to consume less power than the main processor 1221, or to be specific to a specified function. The auxiliary processor 1223 may be implemented as separate from, or as part of the main processor 1221.

The auxiliary processor 1223 may control at least some of functions or states related to at least one component (e.g., the display device 1260, the sensor module 1276, or the communication module 1290) among the components of the electronic device 1201, instead of the main processor 1221 while the main processor 1221 is in an inactive (e.g., sleep) state, or together with the main processor 1221 while the main processor 1221 is in an active state (e.g., executing an application). According to an embodiment, the auxiliary processor 1223 (e.g., an image signal processor or a communication processor) may be implemented as part of another component (e.g., the camera module 1280 or the communication module 1290) functionally related to the auxiliary processor 1223.

The memory 1230 may store various data used by at least one component (e.g., the processor 1220 or the sensor module 1276) of the electronic device 1201. The various data may include, for example, software (e.g., the program 1240) and input data or output data for a command related thereto. The memory 1230 may include the volatile memory 1232 or the non-volatile memory 1234.

The program 1240 may be stored in the memory 1230 as software, and may include, for example, an operating system (OS) 1242, middleware 1244, or an application 1246.

The input device 1250 may receive a command or data to be used by another component (e.g., the processor 1220) of the electronic device 1201, from the outside (e.g., a user) of the electronic device 1201. The input device 1250 may include, for example, a microphone, a mouse, a keyboard, or a digital pen (e.g., a stylus pen).

The sound output device 1255 may output sound signals to the outside of the electronic device 1201. The sound output device 1255 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 1260 may visually provide information to the outside (e.g., a user) of the electronic device 1201. The display device 1260 may include, for example, a display, a hologram device, or a projector and control circuitry to control a corresponding one of the display, hologram device, and projector. According to an embodiment, the display device 1260 may include touch circuitry adapted to detect a touch, or sensor circuitry (e.g., a pressure sensor) adapted to measure the intensity of force incurred by the touch.

The audio module 1270 may convert a sound into an electrical signal and vice versa. According to an embodiment, the audio module 1270 may obtain the sound via the input device 1250, or output the sound via the sound output device 1255 or a headphone of an external electronic device (e.g., an electronic device 1202) directly (e.g., wiredly) or wirelessly coupled with the electronic device 1201.

The sensor module 1276 may detect an operational state (e.g., power or temperature) of the electronic device 1201 or an environmental state (e.g., a state of a user) external to the electronic device 1201, and then generate an electrical signal or data value corresponding to the detected state. According to an embodiment, the sensor module 1276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1277 may support one or more specified protocols to be used for the electronic device 1201 to be coupled with the external electronic device (e.g., the electronic device 1202) directly (e.g., wiredly) or wirelessly. According to an embodiment, the interface 1277 may include, for example, a high definition multimedia interface (HDMI), a universal serial bus (USB) interface, a secure digital (SD) card interface, or an audio interface.

A connecting terminal 1278 may include a connector via which the electronic device 1201 may be physically connected with the external electronic device (e.g., the electronic device 1202). According to an embodiment, the connecting terminal 1278 may include, for example, a HDMI connector, a USB connector, a SD card connector, or an audio connector (e.g., a headphone connector).

The haptic module 1279 may convert an electrical signal into a mechanical stimulus (e.g., a vibration or a movement) or electrical stimulus which may be recognized by a user via his tactile sensation or kinesthetic sensation. According to an embodiment, the haptic module 1279 may include, for example, a motor, a piezoelectric element, or an electric stimulator.

The camera module 1280 may capture a still image or moving images. According to an embodiment, the camera module 1280 may include one or more lenses, image sensors, image signal processors, or flashes.

The power management module 1288 may manage power supplied to the electronic device 1201. According to one embodiment, the power management module 1288 may be implemented as at least part of, for example, a power management integrated circuit (PMIC).

The battery 1289 may supply power to at least one component of the electronic device 1201. According to an embodiment, the battery 1289 may include, for example, a primary cell which is not rechargeable, a secondary cell which is rechargeable, or a fuel cell.

The communication module 1290 may support establishing a direct (e.g., wired) communication channel or a wireless communication channel between the electronic device 1201 and the external electronic device (e.g., the electronic device 1202, the electronic device 1204, or the server 1208) and performing communication via the established communication channel. The communication module 1290 may include one or more communication processors that are operable independently from the processor 1220 (e.g., the application processor (AP)) and supports a direct (e.g., wired) communication or a wireless communication. According to an embodiment, the communication module 1290 may include a wireless communication module 1292 (e.g., a cellular communication module, a short-range wireless communication module, or a global navigation satellite system (GNSS) communication module) or a wired communication module 1294 (e.g., a local area network (LAN) communication module or a power line communication (PLC) module). A corresponding one of these communication modules may communicate with the external electronic device via the first network 1298 (e.g., a short-range communication network, such as Bluetooth™, wireless-fidelity (Wi-Fi) direct, or infrared data association (IrDA)) or the second network 1299 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1292 may identify and authenticate the electronic device 1201 in a communication network, such as the first network 1298 or the second network 1299, using subscriber information (e.g., international mobile subscriber identity (IMSI)) stored in the subscriber identification module 1296.

The antenna module 1297 may transmit or receive a signal or power to or from the outside (e.g., the external electronic device) of the electronic device 1201. According to an embodiment, the antenna module 1297 may include an antenna including a radiating element composed of a conductive material or a conductive pattern formed in or on a substrate (e.g., PCB). According to an embodiment, the antenna module 1297 may include a plurality of antennas. In such a case, at least one antenna appropriate for a communication scheme used in the communication network, such as the first network 1298 or the second network 1299, may be selected, for example, by the communication module 1290 (e.g., the wireless communication module 1292) from the plurality of antennas. The signal or the power may then be transmitted or received between the communication module 1290 and the external electronic device via the selected at least one antenna. According to an embodiment, another component (e.g., a radio frequency integrated circuit (RFIC)) other than the radiating element may be additionally formed as part of the antenna module 1297.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1201 and the external electronic device 1204 via the server 1208 coupled with the second network 1299. Each of the electronic devices 1202 and 1204 may be a device of a same type as, or a different type, from the electronic device 1201.

According to an embodiment, all or some of operations to be executed at the electronic device 1201 may be executed at one or more of the external electronic devices 1202, 1204, or 1208. For example, if the electronic device 1201 should perform a function or a service automatically, or in response to a request from a user or another device, the electronic device 1201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1201. The electronic device 1201 may provide the outcome, with or without further processing of the outcome, as at least part of a reply to the request. To that end, a cloud computing, distributed computing, or client-server computing technology may be used, for example.

According to various embodiments, by implementing a sensor layer for a pressure sensor module in a main board in a production process of the main board without a separate component production process, production process costs can be reduced and a mounting space can be secured.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A mobile electronic device, comprising:
a printed circuit board (PCB) comprising:
at least one processor disposed in a first region of the PCB;
a pressure sensor circuit disposed in a first region of the PCB;
a first electrode pattern and a second electrode pattern disposed on a second region of the PCB and electronically connected to the pressure sensor circuit; and
an elastic member arranged to be at least partially overlapped with the first electrode pattern,
wherein the PCB is formed in a multilayer structure in which a plurality of wiring layers and a plurality of dielectric layers are alternately stacked,
wherein the first electrode pattern and the second electrode pattern are formed on a first wiring layer posited on the second region while patterning the first wiring layer posited on the first region
wherein the first electrode pattern and the second electrode pattern are formed in a structure in which a part of the second region is folded such that the first electrode pattern is overlapped with the elastic member and the second electrode pattern,
wherein the first wiring layer is one of an uppermost wiring layer or a lowermost wiring layer of the PCB, and
wherein the PCB further comprises a display panel or a touch panel disposed on the PCB of the structure in which the first electrode pattern and the second electrode pattern are folded in the second region.

2. The mobile electronic device of claim 1, wherein the second electrode pattern is arranged at a position corresponding to the first electrode pattern on the elastic member.

3. The mobile electronic device of claim 2,
wherein the PCB includes a flexible printed circuit board (FPCB), and
wherein the second electrode pattern is formed using the first wiring layer of a position at least partially overlapped with a region of the PCB comprising the first electrode pattern.

4. The mobile electronic device of claim 1, further comprising:
a spacer enclosing an outer edge of the elastic member between a region of the PCB comprising the first electrode pattern and a region of the PCB comprising the second electrode pattern.

5. The mobile electronic device of claim 4,
wherein one of the first electrode pattern and the second electrode pattern is connected to a ground layer, and
wherein the pressure sensor is formed to receive a change in capacitance through the other of the first electrode pattern and the second electrode pattern.

6. The mobile electronic device of claim 3, further comprising:
a cover layer arranged on an uppermost wiring layer or a lowermost wiring layer of the PCB; and
a cover layer region,
wherein the first electrode pattern or the second electrode pattern is implemented when patterning the uppermost wiring layer or the lowermost wiring layer,
wherein the cover layer region is exposed in which the first electrode pattern or the second electrode is formed, and
wherein the elastic member is arranged on the exposed cover layer region.

7. The mobile electronic device of claim 2,
wherein the PCB further comprises:
a first sub-region of the second region in which the first electrode pattern is formed, and
a second sub-region of the second region in which the second electrode pattern is formed, and
wherein the first sub-region of the second region and the second sub-region of the second region are formed to face each other in structure when the part of the second region is folded.

8. The mobile electronic device of claim 2,
wherein, any one electrode of the first electrode pattern and the second electrode pattern comprises a three-channel pattern, and
wherein the second electrode pattern is formed in a first-channel pattern.

9. The mobile electronic device of claim 1, wherein the first electrode pattern includes a force sensing resistor (FSR) sensor electrode.

10. The mobile electronic device of claim 9, wherein the pressure sensor is configured to detect an input signal based on a resistance value according to a contact area of the first electrode pattern and the elastic member.

11. A mobile electronic device, comprising:
a printed circuit board (PCB) including:
at least one processor disposed in a first region of the PCB; and
a plurality of wiring layers configured to connect the at least one processor to at least one element disposed on the PCB, the plurality of wiring layers comprising:
a circuit pattern configured to drive the electronic device;
a first electrode pattern in a first wiring layer of the plurality of wiring layers; and a second electrode pattern in the first wiring layer configured to form a pressure sensor in the first wiring layer; and an elastic member arranged to be at least partially overlapped with the first electrode pattern and the second electrode pattern, wherein the pressure sensor is electrically connected to the first electrode pattern included in the PCB and configured to apply a voltage to the first electrode pattern and to measure an intensity of the pressure based on a change in the applied voltage, wherein at least a part of the PCB is formed in a folded structure such that a region in which the first electrode pattern is formed and a region in which the second electrode pattern is formed are opposite to each other, wherein the PCB comprises a multilayer structure in which the plurality of wiring layers and a plurality of dielectric layers are alternately stacked, wherein the first wiring layer is one of an uppermost wiring layer or a lowermost wiring layer of the PCB, wherein the at least one processor is disposed on the other of the uppermost wiring layer or the lowermost wiring layer of the PCB, and wherein the at least one processor is connected to the circuit pattern through the other of the uppermost wiring layer or the lowermost wiring layer.

12. The mobile electronic device of claim 11, wherein any one electrode of the first electrode pattern and the second electrode pattern includes a three-channel pattern, and wherein the second electrode pattern is formed in a first-channel pattern.

\* \* \* \* \*